United States Patent
Hayakawa

(10) Patent No.: US 7,210,953 B2
(45) Date of Patent: May 1, 2007

(54) SOCKET FOR ELECTRICAL PARTS

(75) Inventor: Kenji Hayakawa, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/455,721

(22) Filed: Jun. 20, 2006

(65) Prior Publication Data

US 2007/0004261 A1  Jan. 4, 2007

(30) Foreign Application Priority Data

Jun. 30, 2005  (JP) .............................. 2005-191676

(51) Int. Cl.
*H01R 13/62* (2006.01)
(52) U.S. Cl. .................................... 439/331
(58) Field of Classification Search ................ 439/330, 439/331, 266, 342, 268
See application file for complete search history.

(56) References Cited

U.S. PATENT DOCUMENTS 5,646,442 A   7/1997  Abe et al. .................... 257/697

6,280,219 B1 *  8/2001  Sano et al. .................. 439/268

FOREIGN PATENT DOCUMENTS

JP        8-88063        4/1996

* cited by examiner

*Primary Examiner*—Ross Gushi
(74) *Attorney, Agent, or Firm*—Staas & Halsey LLP

(57) ABSTRACT

A socket for an electrical part includes a socket body formed with an accommodation portion in which an electrical part having spherical terminals is accommodated and contact pins arranged to the socket body to be contacted to and separated from the terminals such as solder balls, respectively, and a movable member for elastically deforming the contact pins in a horizontal direction. Each of the contact pins has one elastic piece in form of plate having conductivity and elasticity so as to be elastically deformable along a plate surface direction by the movement of the movable member. The contact pin has a contact portion in form of plate formed at an upper portion of the elastic piece, and the contact portion has a side edge portion which is contacted to or separated from a side surface of the spherical terminal.

8 Claims, 17 Drawing Sheets

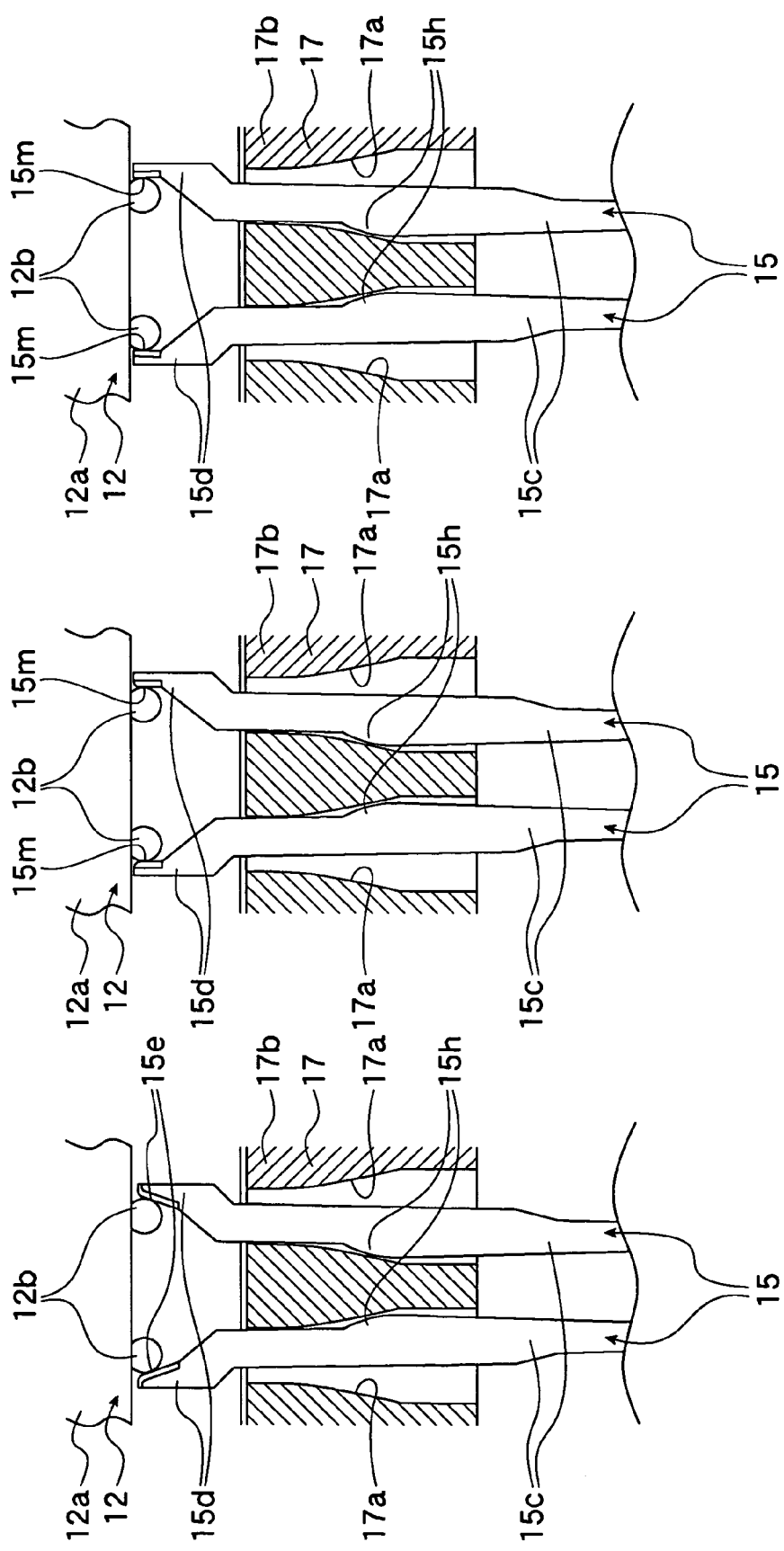

SOCKET FOR ELECTRICAL PARTS

BACKGROUND OF THE INVENTION

1. Field of the Invention

The present invention relates to a socket for an electrical part accommodating an electrical part such as semiconductor device (which may be called hereinlater "IC package").

2. Related Art

A conventional example of such a socket for an electrical part is, for example, disclosed in Japanese Patent Application Laid-open Publication No. HEI 8-88063 as an IC socket. This IC socket has a socket body to which a number of contact pins are arranged, and contact portions of these contact pins contact side surfaces of solder balls as spherical terminals of an IC package.

The contact pins are formed from a sheet of plate by punching and then bending the plate so that the contact pin has, at its upper end portion, a contacting surface having wide area so as to abut against the side surface of the solder ball when assembled.

The contact pins of the structure mentioned above are divided into two or three groups, in which the contact pins in the respective groups are formed with elastic contact pieces, by which opposing forces are caused to thereby prevent the terminals from being offset in every direction including lateral and transverse directions and hence to suitably ensure mutual contacting positions of the contact pins between the respective terminals.

However, in such conventional structure of the contact pins, since the contact pins are formed by punching out the plate and then bending the punched out plate member, these workings involve many working steps, and in addition, in the bending working, it is obliged to select a material for the plate member that can endure the bending working, which limits the materials to be selected. For example, as such material, beryllium copper is generally utilized, but this material has a fear of being deteriorated in elasticity because of influence of heat.

Moreover, since the contact pin is displaceable in a direction perpendicular to the contact surface having a predetermined width, it is necessary to ensure a large movable area in the socket. In addition, the contact surface of the contact pin is contacted in a surface-to-surface fashion to the spherical terminal to thereby establish electrical connection, and then, there is a fear of making worse the electrical conductivity in a case where the surface of the spherical terminal is coarse.

SUMMARY OF THE INVENTION

An object of the present invention is to substantially eliminate defects or drawbacks encountered in the prior art mentioned above and to provide a socket for an electrical part capable of easily forming contact pins with a reduced working process and with increased number of materials selectively usable, reducing movable range of the contact pin and ensuring electrical connection between the contact pin and a spherical terminal.

The above and other objects can be achieved according to the present invention by providing a socket for an electrical part including a socket body provided with an accommodation portion in which an electrical part having spherical terminals is accommodated, and contact pins arranged so as to be contacted to and separated from the terminals, respectively, and a movable member for elastically deforming the contact pins in a horizontal direction, wherein each of the contact pins has one elastic piece in the form of plate having conductivity and elasticity so as to be elastically deformable along a plate surface direction, and the contact pin has a contact portion in the form of plate formed at an upper portion of the elastic piece, the contact portion having a side edge portion which is contacted to or separated from a side surface of the spherical terminal.

According to this aspect of the present invention, the contact pin has a single flat plate-shaped elastic piece which is deformed in a direction along the plate surface, and accordingly, in comparison with an elastic piece which is deformed in a perpendicular direction to the plate surface, the moving range thereof can be reduced. Moreover, in a case where a pair of electrical pieces is disposed, even if they are deformed along the plate surface direction, they have a wide width in the plate thickness direction and, hence, they move in a wide movable range. In comparison, in the present invention, since only the single elastic piece is provided, the width in the plate thickness direction can be reduced and, hence, the movable range thereof can be also reduced, thus realizing narrow pitch of the contact pins.

In addition, in the present invention, the side edge portion of the contact portion formed to the upper end of the elastic piece contacts or separates from the side surface of the spherical terminal such as a solder ball. Accordingly, in comparison with the contact pin in which the contact portion contacts the spherical terminal at its surface, not side edge portion, since the side edge portion thereof slightly bites the spherical terminal, the electrical conductivity between the contact pin and the spherical terminal can be ensured.

In preferred embodiments or examples in the above aspect, the contact pins may be arranged such that contacting directions of the contact pins differ from each other so that horizontal forces to be applied from the contact pins to the terminals are equilibrium as a whole structure of the socket body.

The adjacent contact pins may apply operation forces to the corresponding spherical terminals in directions reverse to each other.

It may be desired that the contact pin contacts the terminal such that the side edge portion of the contact portion of the contact pin contacts the side surface of the terminal in the direction along a diameter direction thereof.

It is desirable that the contact portion of the contact pin has an inclining portion which contacts a surface of a lower half portion of the spherical terminal except a lowest portion thereof.

It may be desired that the socket is an IC socket and the terminal is a solder ball.

The contact pin may be composed of a base portion, a solder tail portion extending downward from the base portion, a single elastic piece extending upward from the base portion so as to be elastically deformable, and a contact portion formed to an upper portion of the elastic piece, the contact portion being provided with an inclining portion contacting the spherical terminal.

According to the above characteristic features of the preferred examples, the forces applied from all the contact pins can be made equilibrium in the entire structure of the socket by the simple change in the structure thereof.

That is, in the conventional structure, the spherical terminal is clamped from both sides by the paired contact portions of the elastic pieces, and in such structure, equal forces are applied to the spherical terminal in the opposing directions from both sides thereof with being clamped by the paired elastic pieces. Accordingly, even if forces are applied from a number of contact pins, the horizontally equilibrium condition can be maintained (i.e., balanced) in the entire structure of the socket for the electrical part.

On the other hand, when the single elastic piece is contacted to the spherical terminal only from one direction, all the forces are applied to the spherical terminals from one same direction, which will act to the electrical part to move it on one same direction. In such case, a stopper member is needed to stop or limit the movement of the electrical part. Taking this matter into consideration, in the present invention, the contact pins are arranged so that the contacting directions of the elastic pieces to the spherical terminals differ from each other to keep the equilibrium condition of the applied forces. According to such arrangement, there is no need for disposing any stopper member, thus making compact the entire structure of the socket.

Furthermore, the contact pin is formed by punching out a plate member having electrical conductivity and elasticity so as to have a single elastic piece in the form of plate, which is elastically deformable along the plate surface direction. The elastic piece has the contact portion at its upper end portion so that the side edge portion thereof contacts the side surface of the spherical terminal. Accordingly, any bending working, which is required in the conventional technology, is not needed and the contact pin can be formed only by punching out the flat plate member, thus reducing the number of workings and easily forming the contact pin. In addition, it is not necessary to use a material which is strong against the bending working, thus widely selecting the material, and in addition, by utilizing a material having less stress relaxation, the initial contacting pressure can be substantially maintained even after the heating process.

Still furthermore, according to the preferred embodiment of the present invention, since the adjacent contact pins in a number of contact pins are arranged so as to apply the force to the spherical terminal from opposing directions by, for example, alternately arranging the contact pins having the same shape so as to face opposing directions, the contact pins can be easily formed without forming contact pins having different shapes, and in addition, the arrangement thereof can be easily performed, thus being convenient and advantageous.

Still furthermore, according to the present invention, since the side edge portion of the contact portion of the contact pin can contact the side surface of the spherical terminal along the diameter direction thereof, the possibility of causing injury can be reduced. That is, if the contacting direction of the contact portion of the contact pin is offset from the diameter direction of the spherical terminal, the contact portion may act to scrub the side portion of the terminal, and thus, there is a fear of causing burr or injury to the spherical terminal. On the contrary, as in the present invention, when the side edge portion of the contact portion contacts the side surface of the spherical terminal along the diameter direction, the side edge portion of the contact portion slightly bites the spherical terminal even if the terminal is formed of a soft material, thus preventing the burr or injury from causing.

Still furthermore, according to the present invention, the inclining portion is formed to the contact portion of the contact pin so that the inclining portion contacts the lower half of the spherical terminal except the lowest end, and therefore, when the elastic force of the elastic piece acts to the inclining portion, the inclining portion slides along the lower half of the spherical terminal except the lowest end thereof, thereby achieving the wiping effect. Moreover, since the contact portion of the contact pin never contact the lowest end of the terminal, the lowest end is not injured, and hence, no bad influence is applied when the spherical terminal is electrically contacted to the printed circuit board.

Furthermore, according to a modified aspect of the present invention, there is provided a socket for an electrical part comprising:

a socket body to which an accommodation portion is formed so as to accommodate the electrical part and to which a number of contact pins are provided so as to be contacted to or separated from terminals of an electrical part;

a movable member formed to the socket body so as to deform the contact pin through vertical movement thereof; and an operation member for vertically moving the movable member, wherein the contact pin is provided with a single elastic piece in form of plate having conductivity and elasticity so as to be elastically deformable by the movement of the movable member along a plate surface direction, and the contact portion of the contact pin has a side edge portion which is contacted to or separated from a side surface of the spherical terminal.

It is further to be noted that the nature and further characteristic features of the present invention will be made more clear from the following descriptions made with reference to the accompanying drawings.

BRIEF DESCRIPTION OF THE DRAWINGS

In the accompanying drawings:

FIG. 8 shows the contact pin of the IC socket in which

FIG. 17 includes FIGS. 17A, 17B and 17C, which are views showing modified examples of the contact portions of the contact pins; and FIG. 18 including

DESCRIPTION OF THE PREFERRED EMBODIMENT

Figure 1:
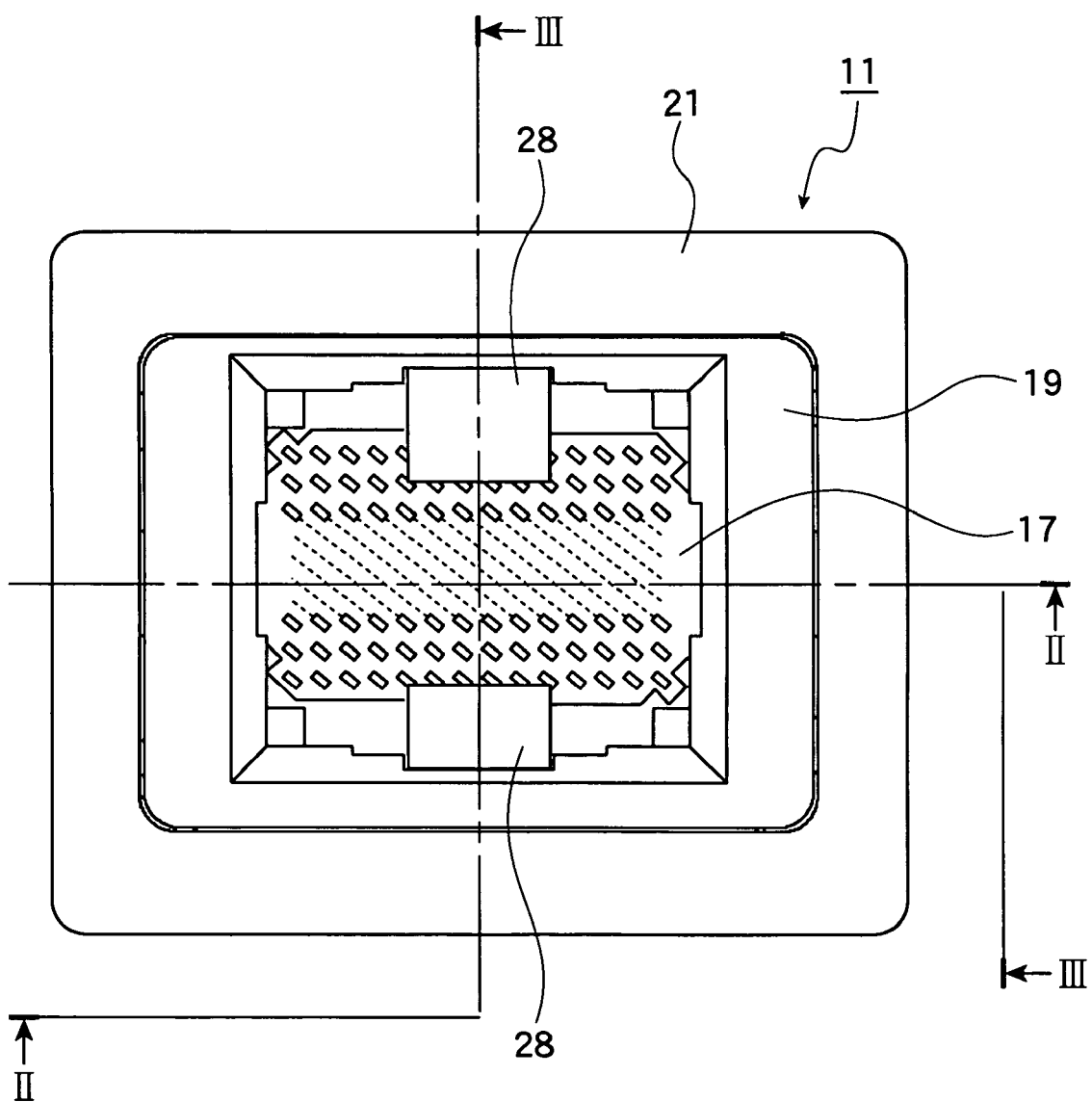
FIG. 1 is a plan view of an IC socket according to a first embodiment of the present invention.

One preferred embodiment of the present invention will be described hereunder with reference to the accompanying drawings. Further, it is to be noted that terms "upper", "lower", "right", "left" and the like terms are used herein with reference to the illustration of the drawings or in generally usable state of the socket of the present invention.

With reference to FIGS. 1 to 16, reference numeral 11 denotes an IC socket as a socket for an electrical part, to which an IC package as an electrical part is accommodated to thereby establish an electrical connection between the IC package 12 and a printed circuit board, not shown, through the IC socket 11. According to such electrical connection, a performance test for the IC package 12 is carried out.

Figure 6:
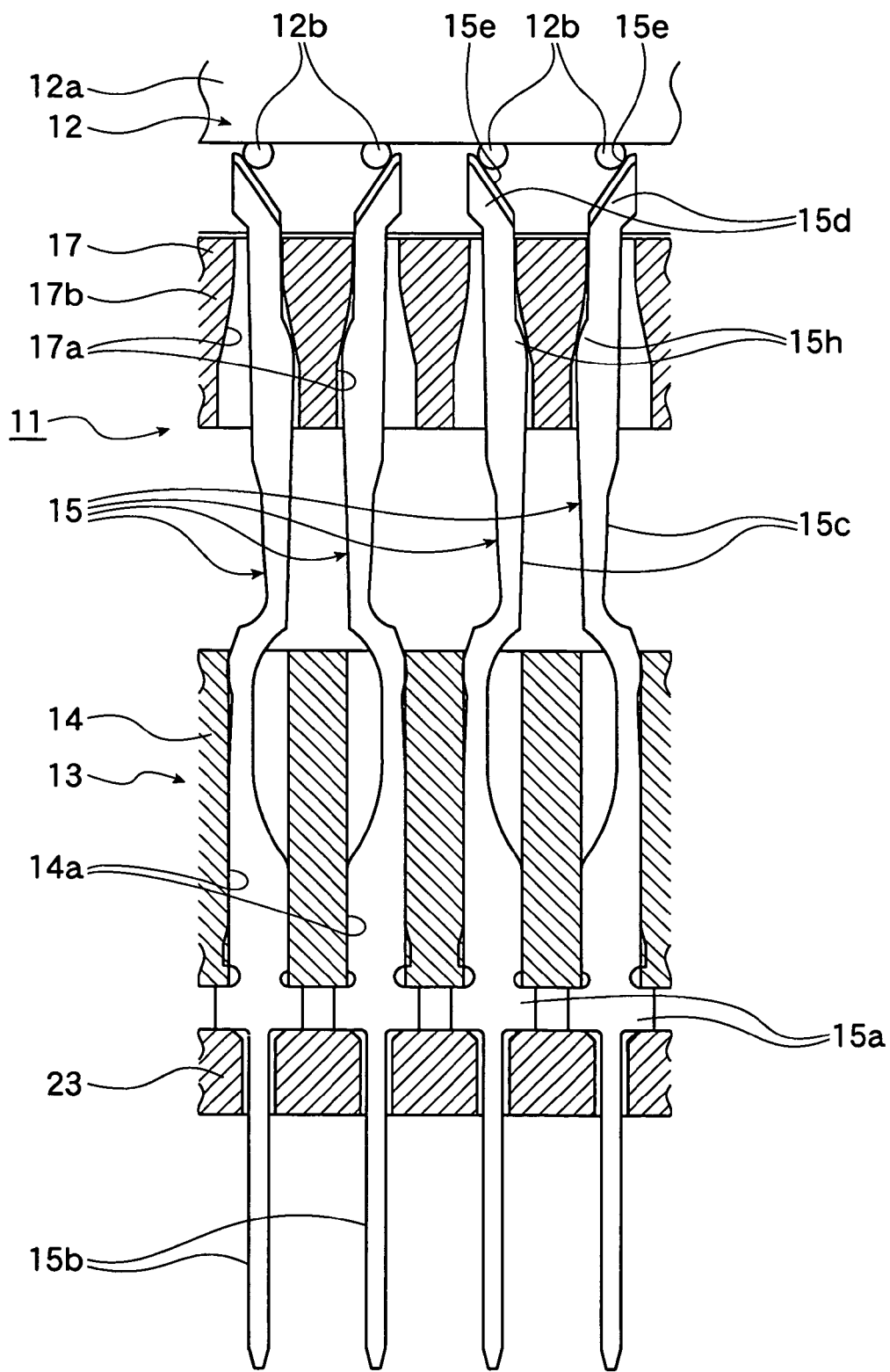
FIG. 6 is a sectional view showing an arrangement of contact pins according to the first embodiment in a state that the movable member is disposed at the most upward position.
Figure 7:
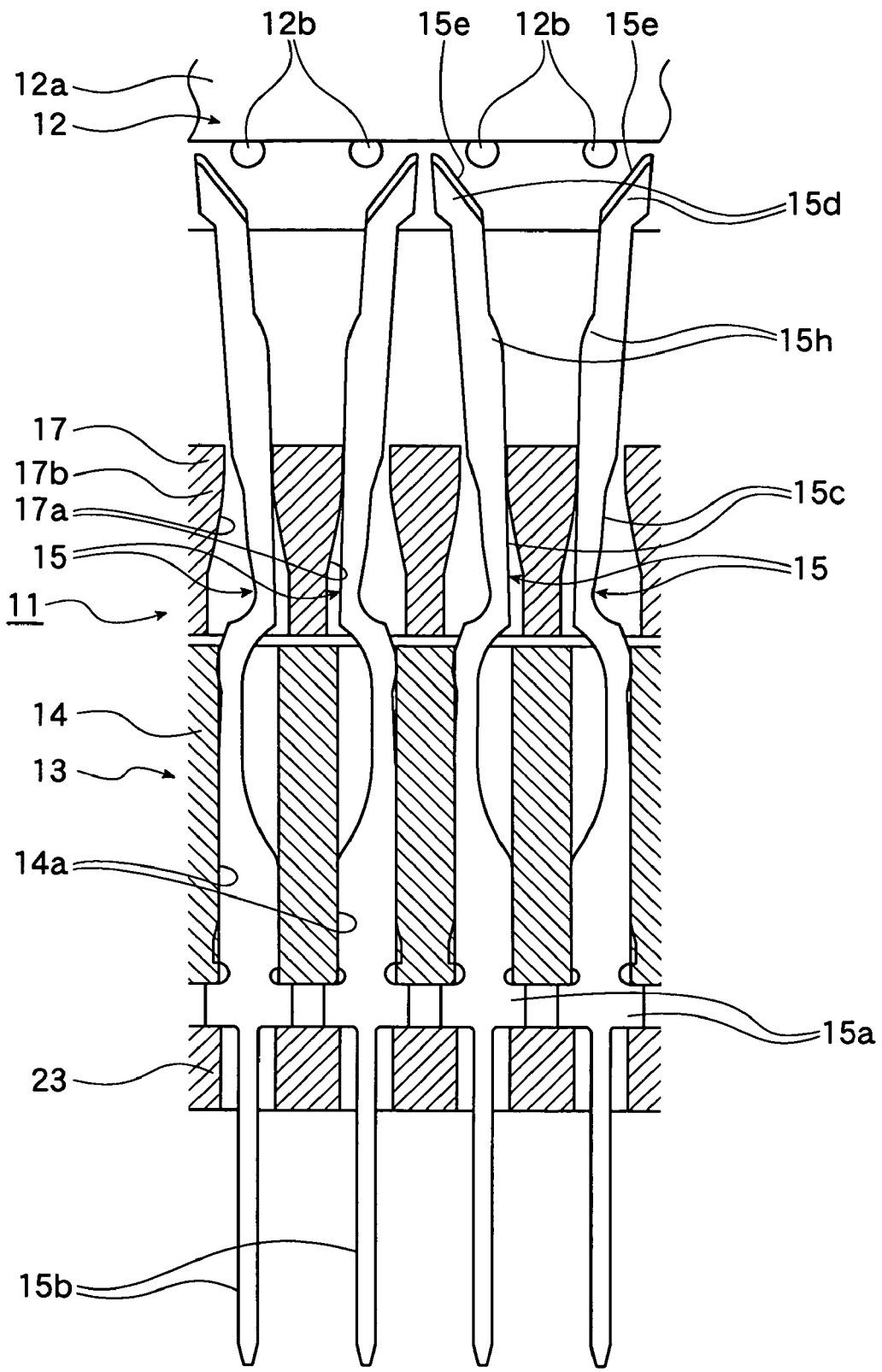
FIG. 7 is a sectional view showing an arrangement of contact pins according to the first embodiment in a state that the movable member is disposed at the most downward position.

The IC package 12 is, as shown in FIGS. 6 and 7, so-called a BGA (Ball Grid Array) type, in which a number of ball-shaped solder ball 12b as spherical terminals are arranged to the lower surface of a square package body 12a in an arrangement of matrix having vertical and transverse lines or rows.

Figure 2:
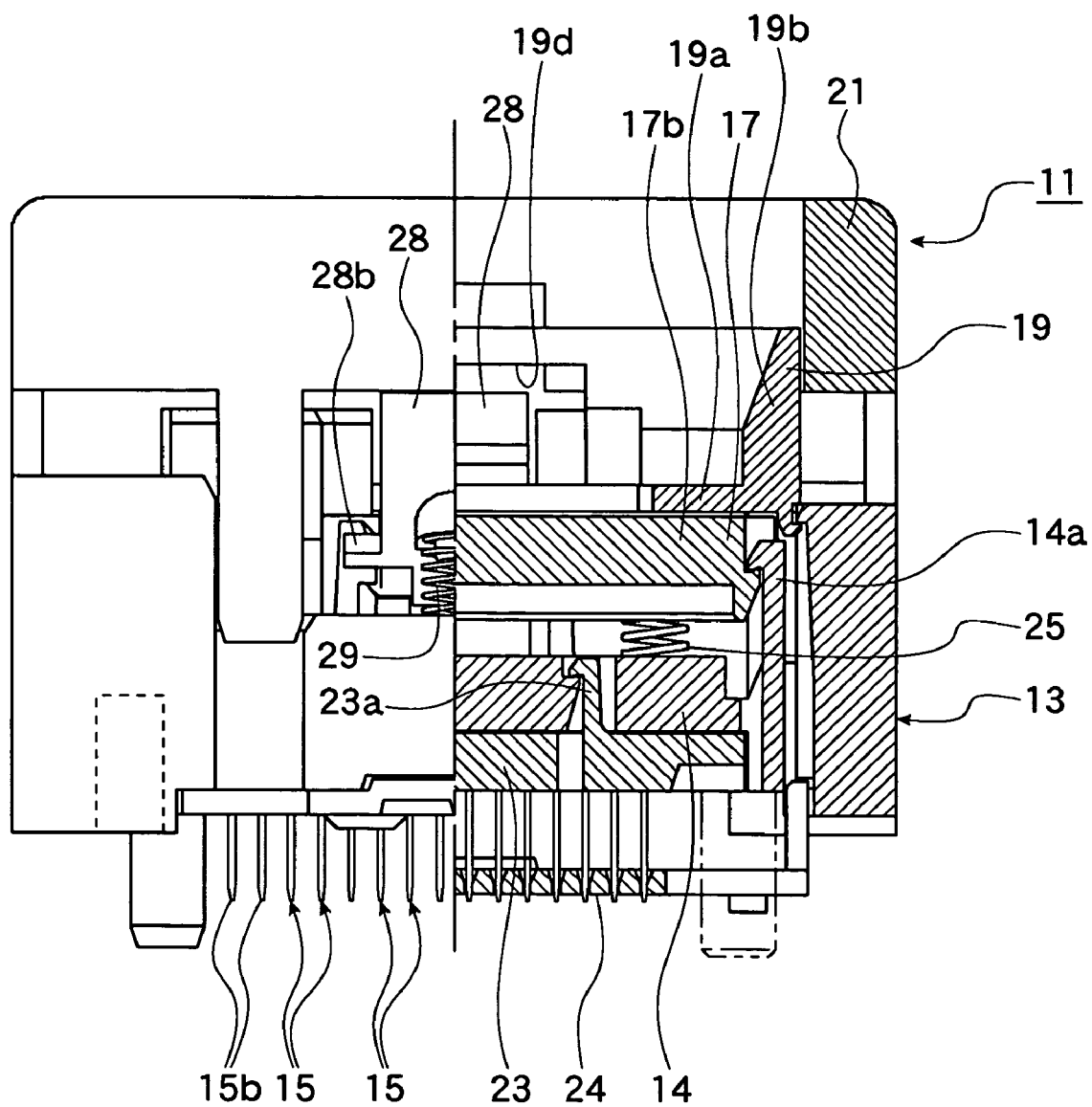
FIG. 2 is a sectional view taken along the line II—II in FIG. 1.
Figure 3:
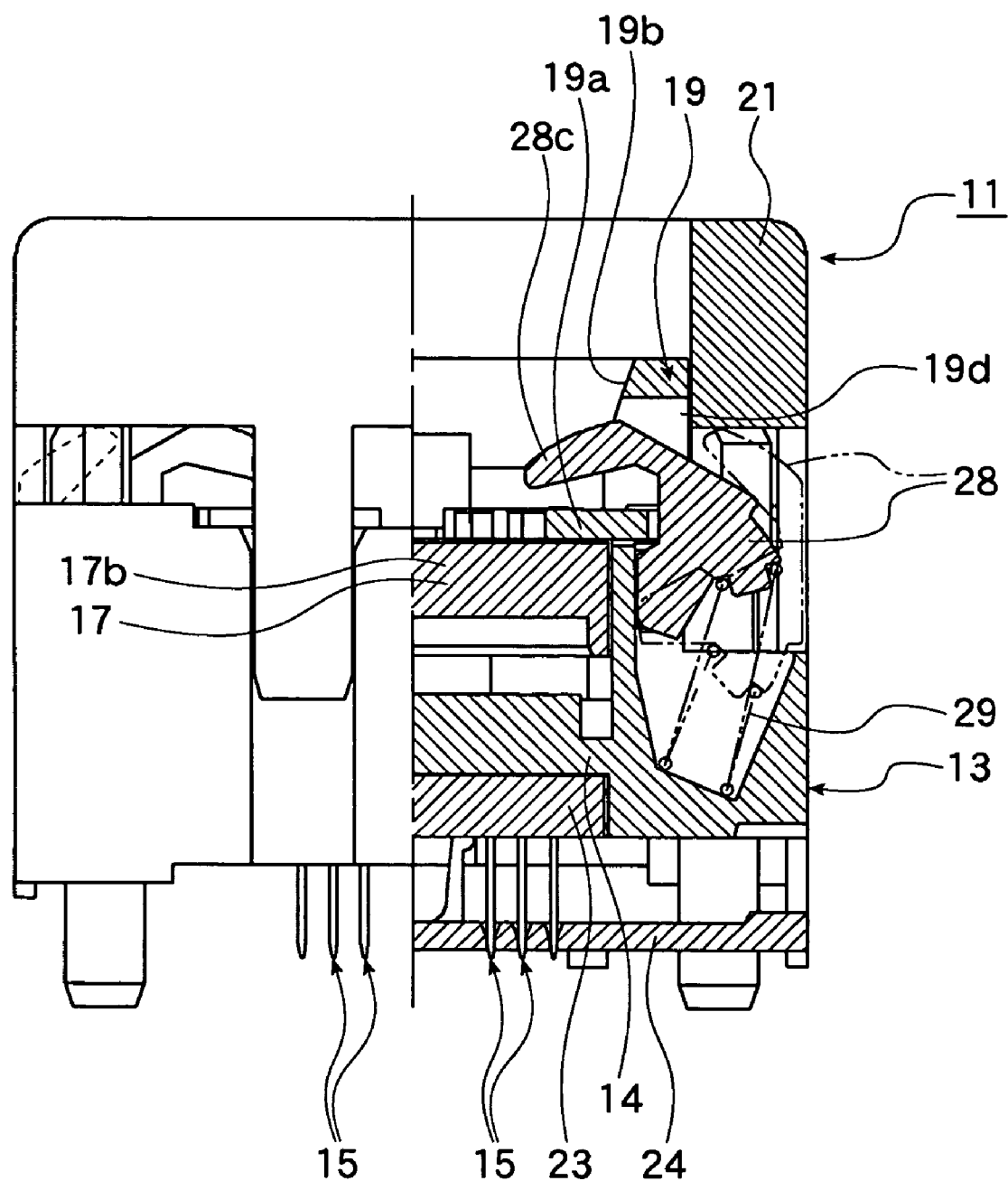
FIG. 3 is a sectional view taken along the line III—III in FIG. 1.
Figure 4:
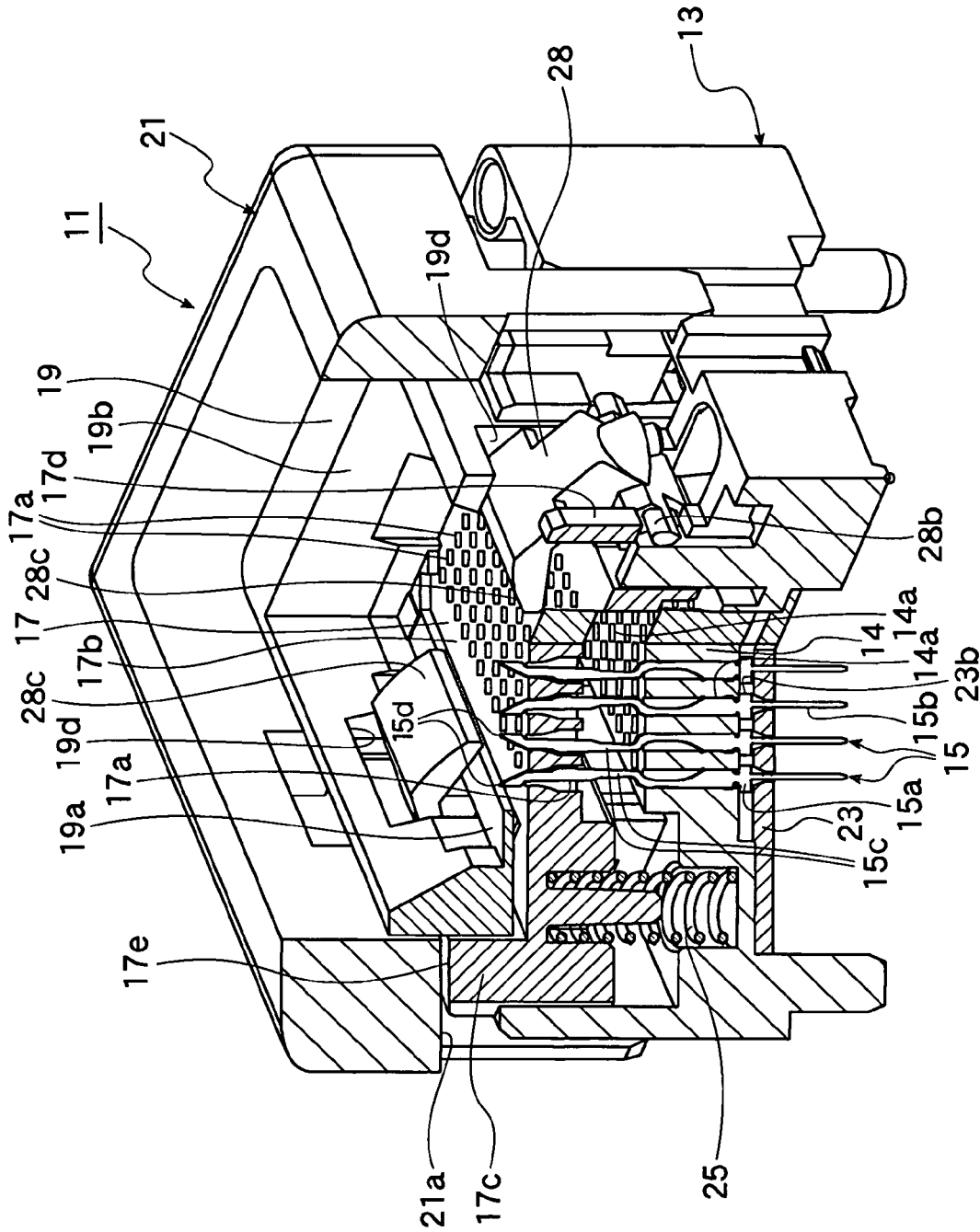
FIG. 4 is a perspective view, partially in section, of the IC socket according to the first embodiment of the present invention, showing a state that a movable member is disposed at the most upward position.

On the other hand, as shown in FIGS. 2 to 4, the IC socket 11 is provided with a socket body 13 formed of synthetic resin which is mounted on a printed circuit board, not shown, and a number of contact pins 15, which is contacted to or separated from the solder balls 12b of the IC package 12, are provided for this socket body 13. A movable member 17 for displacing the contact pins 15 is also mounted to the socket body 13, and a guide member 19, as an IC package accommodation portion, is also secured to the socket body 13 above the movable member 17. An operation member 21 for vertically moving the movable member 17 is further disposed to the socket body 13.

Figure 8A:
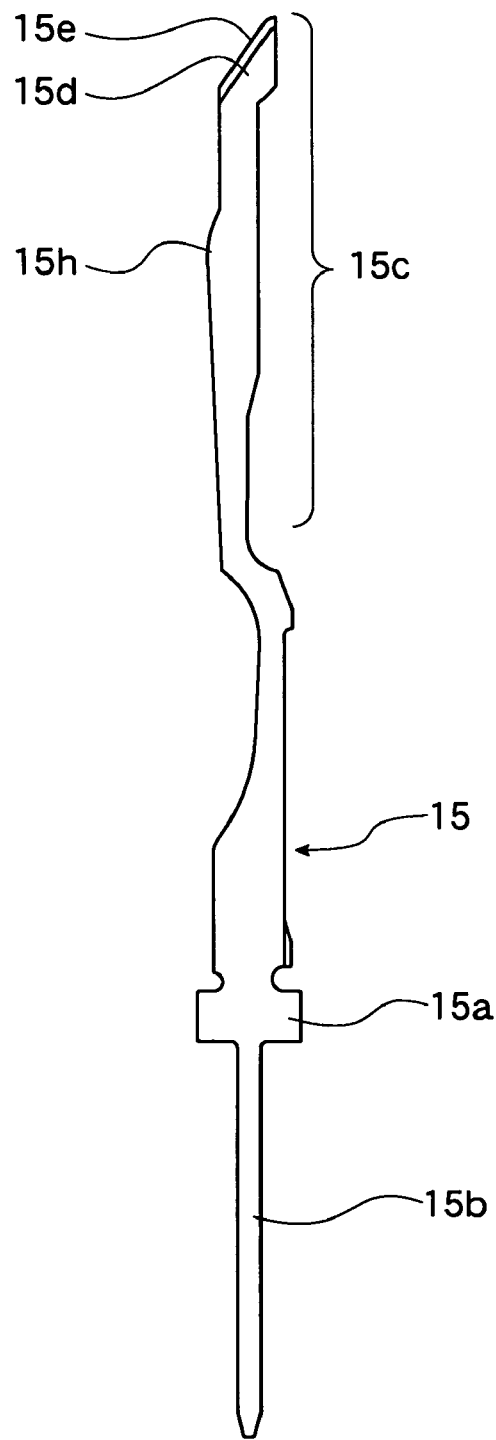
FIG. 8A is a front view thereof and FIG. 8B is a right side view thereof.
Figure 8B:
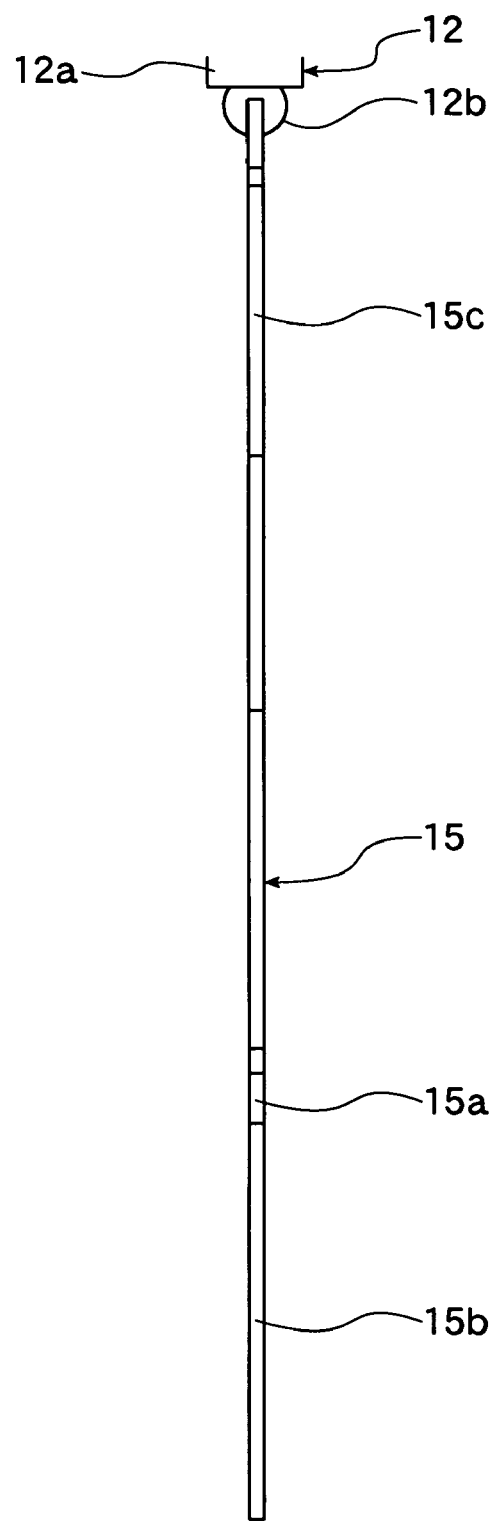

The contact pins 15 are formed from a conductive and elastic plate member punched out by a press working so as to provide a shape shown in FIGS. 6 to 8.

More in detail, each contact pin 15 is formed of, for example, titanium-copper alloy or tin-nickel-copper alloy, and is composed of a base portion 15a at a vertically central portion as a stopper portion, a single solder tail portion 15b on the lower side of the base portion 15a and a single elastic piece 15c on the upper side of the base portion 15a.

The elastic piece 15c is formed to be elastically deformable in a direction along the plate surface, and has an upper (i.e. front) end portion at which a contact portion 15d contacting or separating from the side portion of the solder ball 12b of the IC package 12 so that the solder ball 12b is contacted by the contact portion 15d to thereby establish an electrical connection between the IC package 12 and socket body 13.

As shown in FIGS. 6 to 8, the contact portion 15d of the contact pin 15 is formed with an inclining portion 15e at a side edge portion thereof, and this inclining portion 15e contacts the lower spherical portion of the solder ball 12b except the lowest end portion thereof.

The elastic piece of the contact pin 15 is formed with a sliding portion 15h along a predetermined length thereof, and this sliding portion 15h projects over the base member 14 and fitted into an insertion hole 17a of the movable member 17. When the movable member 17 is vertically moved, an inner wall section of the insertion hole 17a slides along the sliding portion 15h, the elastic piece 15c is elastically deformed, and the contact portion 15d is hence displaced.

The bore diameter of the insertion hole 17a of the movable member 17 is made larger toward downward, and when the movable member 17 is lowered, the sliding portion 15h of the elastic piece 15c is pushed, as shown in FIG. 7, so as to open the contact portion 15d.

Furthermore, as shown in FIG. 6, the contact portion 15d projects over the movable member 17 even when the movable member is in the most upward position, in which the inclining portion 15e as the side edge of the contact portion 15d contacts the solder ball 12b to thereby establish an electrical connection.

As shown in FIG. 2, below the base member 14, a bottom plate 23 is engaged with an engagement piece 23a so as to be attached to the base member 14, and the solder tail portion 15b of the contact pin 15 is inserted into the insertion hole 23a of the bottom plate 23, as shown in FIGS. 4 and 6, so that the base portion 15a of the contact pin 15 is clamped between the bottom plate 23 and the base member 14 to thereby block the downward movement of the contact pin 15.

Furthermore, a location board 24 is disposed on the lower side of the bottom plate 23 to be vertically movable. The solder tail portion 15b projecting downward from the bottom plate 23 further extends downward, as shown in FIGS. 2 and 3, through the location board 24 and is then inserted into the insertion hole formed to the printed circuit board. The extended end is soldered and thus connected.

The contact pins 15 of the structure mentioned above are arranged as shown in FIG. 1 in a matrix having vertical and transverse rows or lines so as to be elastically deformable in a direction parallel with the diagonal line. Forces acting to the solder balls 12b from the contact pins 15 is set to keep the equilibrium state by arranging the contact portions 15d of the contact pins 15 with contacting directions to the solder balls 12b being changed. Herein, as shown in FIGS. 6 and 7, with the adjacent contact pins 15, the forces are applied to the respective solder balls 12b in directions different from each other (i.e. opposing directions to each other).

Figure 9:
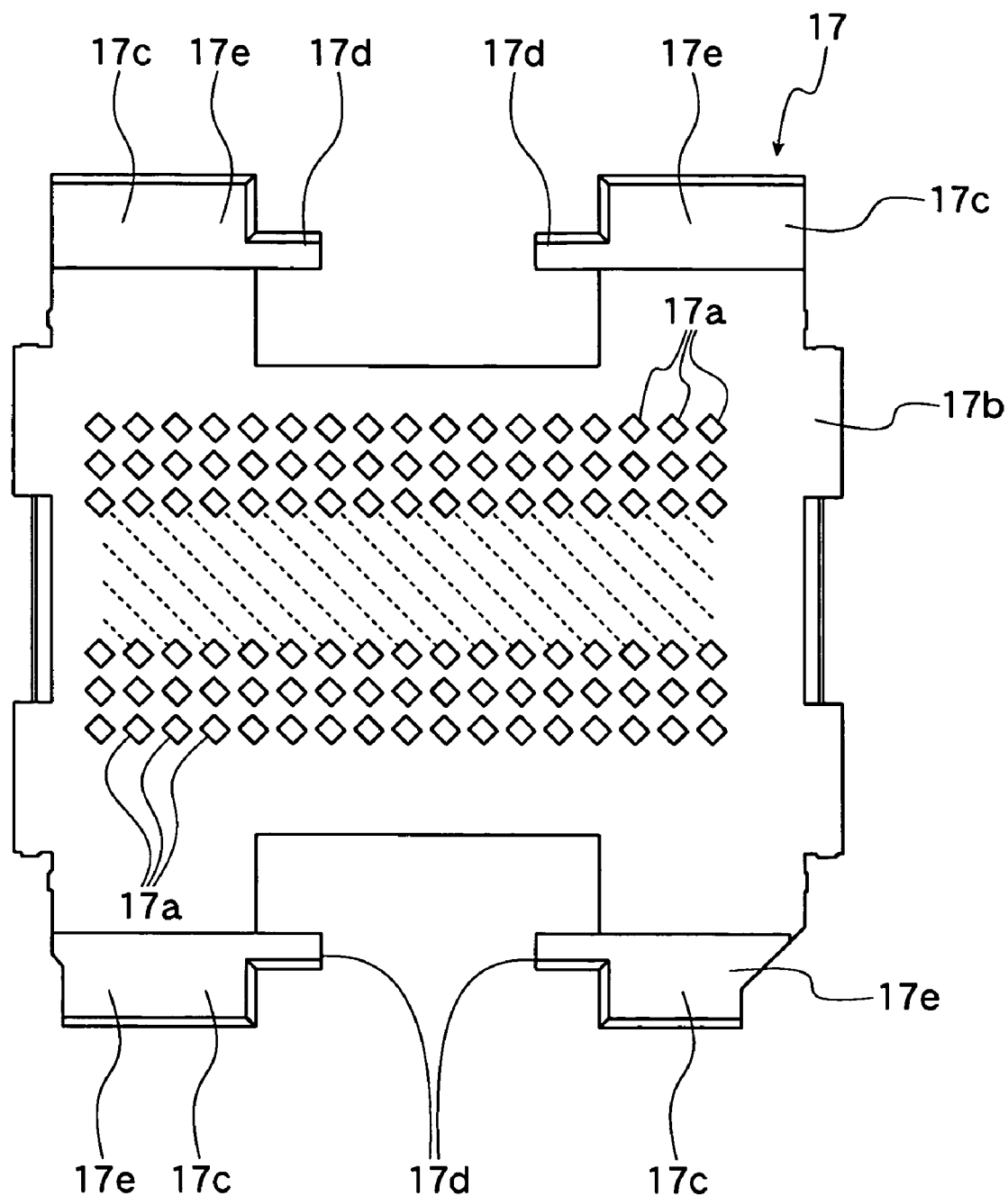
FIG. 9 is a plan view showing the movable member of the IC socket of the first embodiment.
Figure 10:
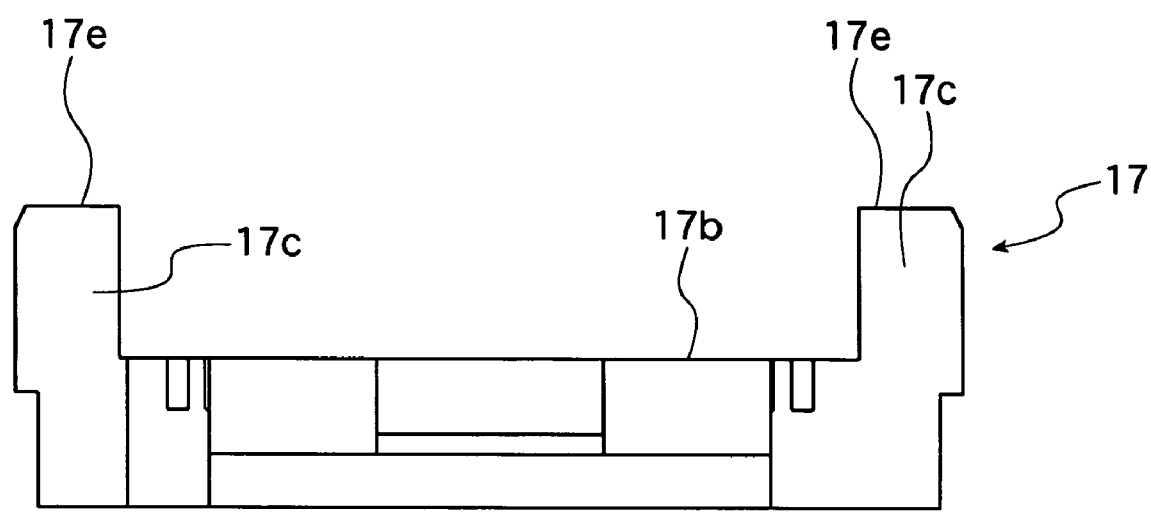
FIG. 10 is a right side view of FIG. 9.
Figure 11:
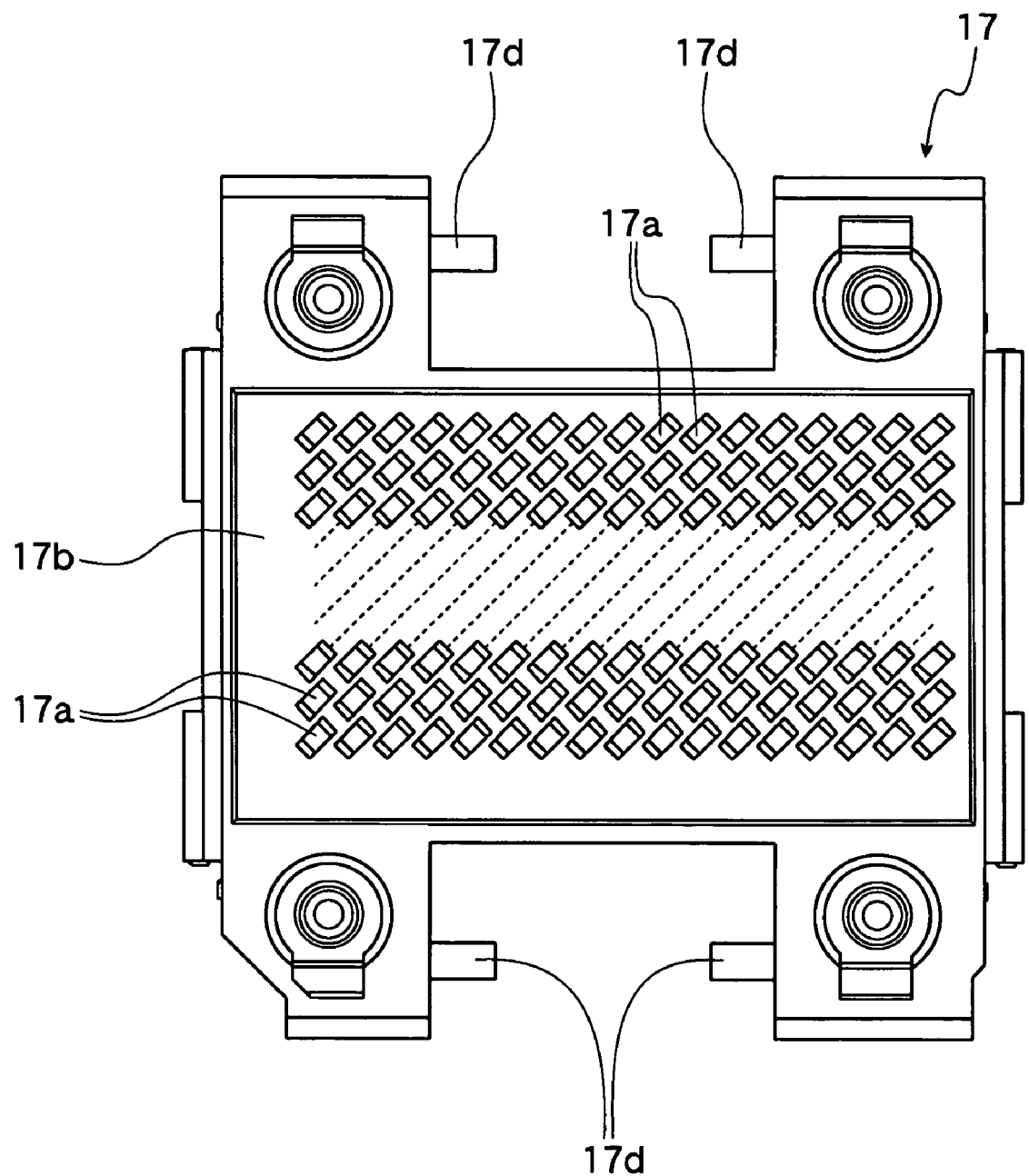
FIG. 11 is a bottom view of FIG. 9.

On the other hand, the movable member 17 is composed of, as shown in FIGS. 9 to 11, a movable member body 17b, in the form of flat plate, having a plurality of insertion holes 17a, and a projection piece 17c projecting upward from an end edge portion of the movable member body 17b. The movable member 17 is urged upward by a coil spring 25, and the engagement portion 14b projecting from the base member 14 is engaged with the movable member 17, as shown in FIG. 2, to thereby restrict the upward movement of the movable member 17.

Further, the guide member 19 in the form of frame is disposed above the movable member 17 and inside the projection piece 17c. The guide member 19 has a support piece 19a supporting the peripheral edge portion of the package body 12a and a guide piece 19b provided to the peripheral edge portion of the support piece 19a so as to project upward for guiding the IC package 12 when accommodated. The guide member 19 further has an engaging piece 19c, as shown in FIG. 2, so as to project downward, and this engaging piece 19c is engaged with the base member 14 to thereby fix the guide member 19 thereto. The guide member 19 is formed with an opening 19d through which a latch member 28 is inserted in or out as mentioned hereinlater.

Figure 5:
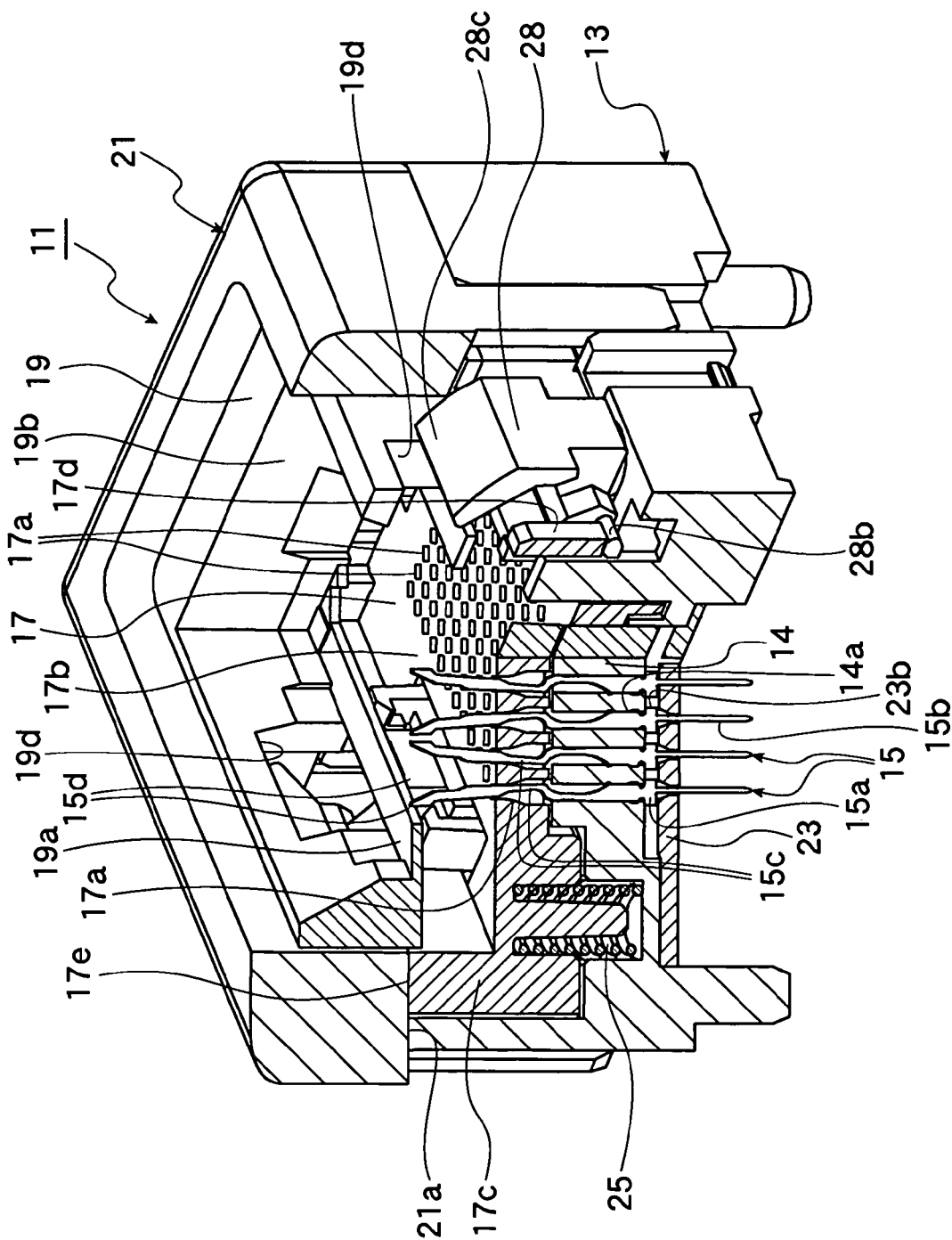
FIG. 5 is a perspective view, partially in section, of the IC socket according to the first embodiment of the present invention, showing a state that a movable member is disposed at the most downward position.
Figure 12:
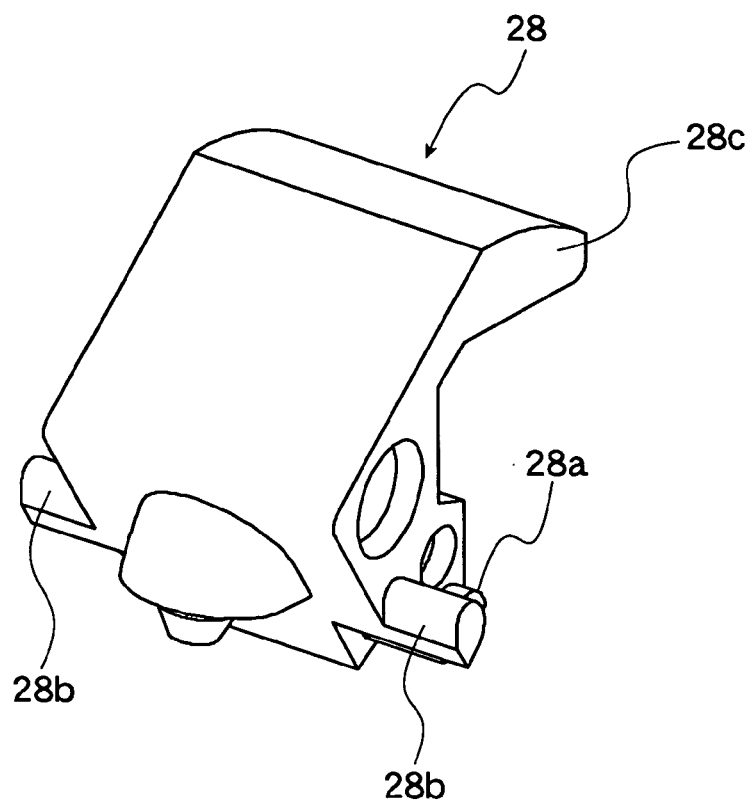
FIG. 12 is a perspective view of a latch viewed from an upper side thereof of the first embodiment.
Figure 13:
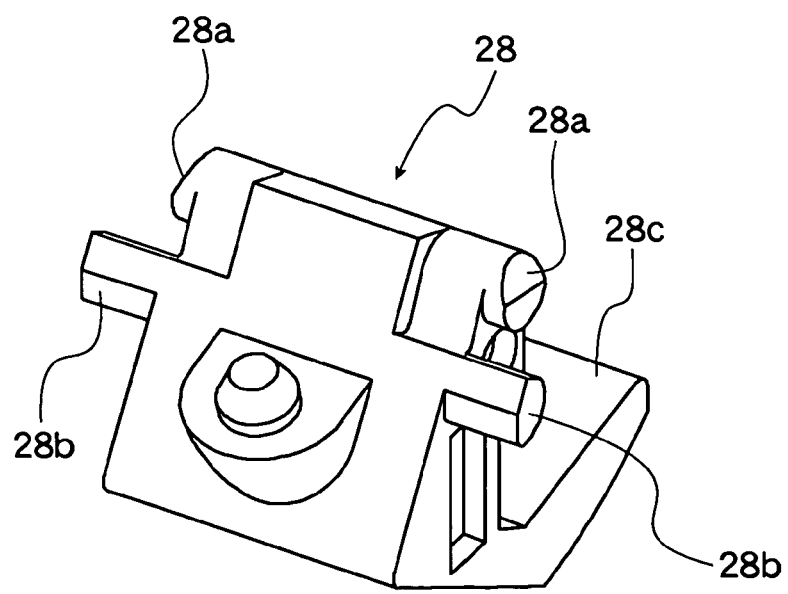
FIG. 13 is a perspective view of the latch viewed from a lower side thereof.
Figure 14:
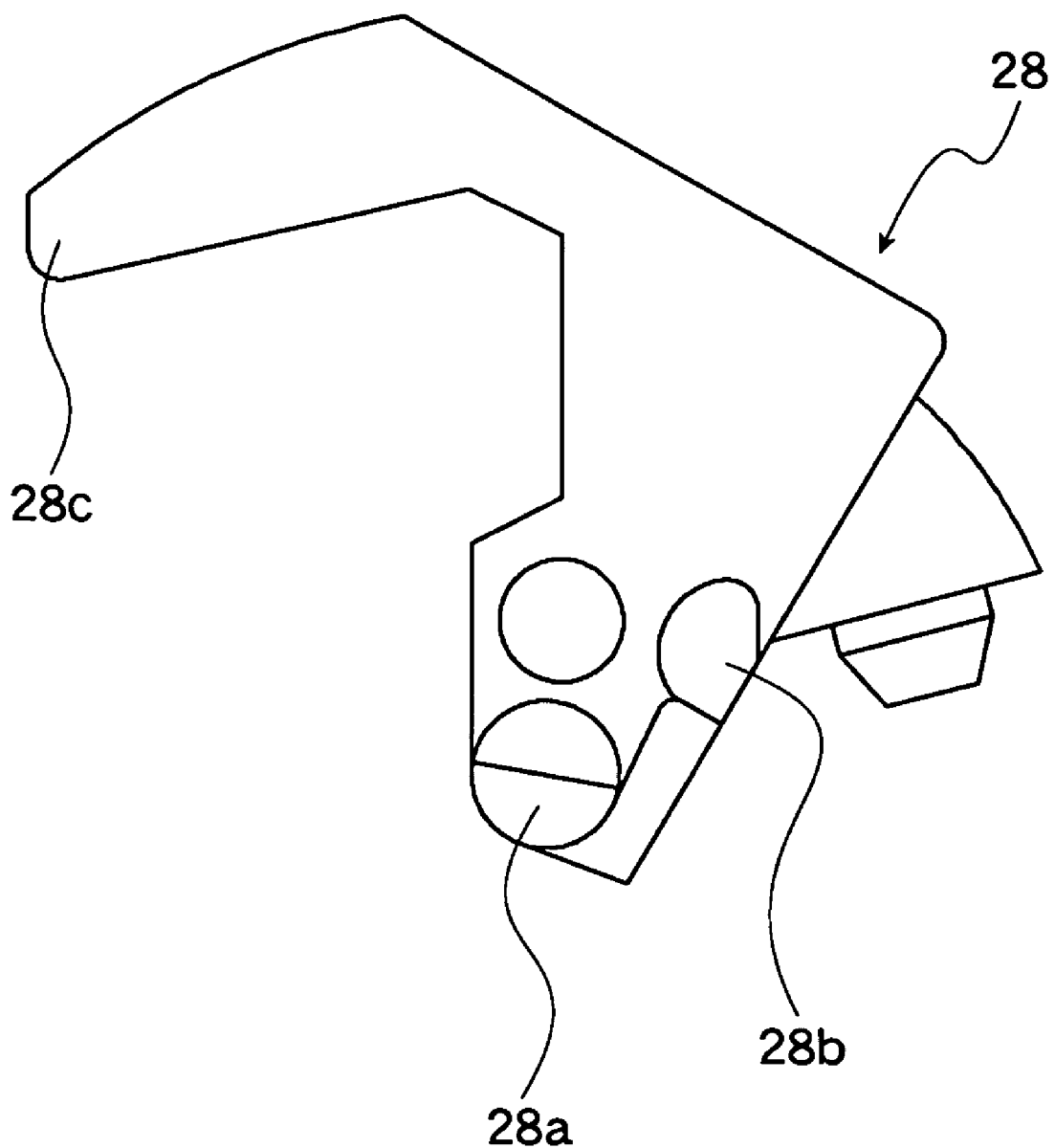
FIG. 14 is a side view of the latch.

The latch member 28 has, as shown in FIGS. 12 to 14, a rotation shaft 28a and is provided for the socket body 13 to be rotatable around this rotation shaft 28a. The latch member 28 also has, as shown in FIG. 5, a pair of pressed portions 28b (portions to be pressed by the pressing portion 17d of the movable member 17) on both side portions thereof. The latch member 28 is urged, as shown in FIG. 3, by a spring 29 in a direction to be closed, and also has a press portion 28c formed to the front end of the latch member 28 so as to abut against the upper surface of the peripheral edge portion of the IC package 12 to thereby press the same.

When the movable member 17 is moved downward, the pressing portion 17d of the movable member 17 presses the portion 28b of the latch member 28. As shown in FIG. 3, the latch member 28 is rotated to be opened from the position shown with solid line to the position shown with two-dot-dash line, and the press portion 28c of the latch member 28 is retired from the IC package accommodation and take-out line.

Incidentally, the operation member 21 has a frame-like rectangular shape and is disposed around the guide member 19 to be vertically movable around the socket body 13. The operation member 21 has a pressing surface 21a for pressing a surface 17e to be pressed formed to the upper surface of the projection piece 17c of the movable member 17, and when the operation member 21 is pressed against the urging force of the coil spring 25, the movable member 17 is lowered.

The IC socket 11 of the structures mentioned above will operate in the manner mentioned hereunder.

In order to set the IC package 12 to the IC socket 11, the operation member 21 is first moved downward. Then, the movable member 17 is pushed also downward by the movement of the operation member 21 and lowered against the urging force of the coil spring 25.

According to the lowering movement of the movable member 17, the contact portion 15d of the contact pin 15 is displaced in a direction apart from the solder ball 12b and the latch 28 is then opened.

That is, when the movable member 17 is lowered, the portion 28b of the latch 28 is pressed and the latch 28 is rotated to the position shown with two-dot-dash line in FIG. 2 against the urging force of the spring 29. According to this motion, the press portion 28c of the latch 28 is retired from the IC package accommodation/take-out line.

Moreover, when the movable member 17 is moved from the state shown in FIG. 6 to the state shown in FIG. 7, the sliding portion 15h of the elastic piece 15c of the contact pin 15 is pressed by the peripheral wall section of the insertion hole 17a of the movable member 17 and the contact portion 15d of the contact pin 15 is hence deformed.

Under this state, the IC package 12 is guided by the guide piece 19b and accommodated to a predetermined position on the support piece 19a, and the respective solder balls 12b of the IC package 12 are inserted into portions near the displaced contact portions 15d of the contact pins 15, respectively, in a non-contact state, which is shown in FIG. 7.

Thereafter, when the operation member 21 is released from the downward pressing force, the movable member 17 is moved upward by the urging force of the coil spring 25 and the latch 28 is rotated in the closing direction by the urging force of the spring 29, whereby the IC package 12 is pressed by the movable member 17 to thereby prevent the IC package 12 from floating.

Further, when the movable member 17 is moved upward, the pressing force of the sliding portion 15h of the contact pin 15 is released, and the contact portion 15d thereof is moved toward the solder ball 12b, and then, the inclining portion 15e of the contact portion 15d contacts the solder ball 12b and slides therealong.

According to such motion, the solder balls 12b of the IC package 12 and the printed circuit board are electrically connected through the contact pins 15, respectively.

On the other hand, when the IC package 12 is dismounted from the accommodated state, the operation member 21 is lowered through the movement of the movable member 17. According to this movement, the latch member 28 is retired from the IC package accommodation/take-out area and the contact portion 15d of the contact pin 15 is separated from the solder ball 12b, so that the IC package 12 is easily removed with a weak force in comparison with a case that the solder ball is clamped between a pair of contact portions.

In the IC socket of the characters mentioned above, by simply improving the structure, the forces applied to all the contact pins 15 can be made equilibrium to the entire structure of the socket.

That is, in an IC socket of the conventional structure in which the solder ball is clamped from its both sides by a pair of elastic pieces of the contact pin, equal forces are applied in two opposite directions to the solder ball with the solder ball being clamped from both sides by the paired elastic pieces, so that even if forces are applied by a number of contact pins, the parallel equilibrium condition can be maintained as the entire structure of the socket, thus being well balanced. However, as in the present invention, when the single elastic piece 15c of the contact pin 15 contacts from only one direction to the solder ball 12b, only the single directional force is applied to the solder ball 12b.

Therefore, when the force is applied from the same direction, the force is also applied to the IC package 12 to move it in this direction, and in such case, a stopper is needed to stop the movement of IC package 12. Accordingly, in the present invention, in order to obviate this matter, the contact pins 15 are arranged such that the contact portion 15d of the contact pin 15 contacts each solder ball 12b from a different (for example, opposing) direction respectively so as to make equilibrium the total forces to be applied to the solder balls 12b. Thus, there is no need for disposing any stopper member for stopping the movement of the IC package 12, thus simplifying the structure.

Furthermore, the contact pins 15 are formed by punching out a plate-shaped material having conductivity and elasticity into a flat plate shape so as to have the single elastic piece 15c elastically deformable in a direction of the plate surface, and the side edge portion of the plate-shaped contact portion 15d formed to the upper end portion of the elastic piece 15c is contacted to or separated from the side surface of the solder ball 12b. Accordingly, it is not necessary to carry out the plate bending working as seen in the conventional structure, and only necessary to punch out the plate member, so that the contact pins can be easily manufactured with reduced working process, and in addition, since no bending working is needed, it is not necessary to manufacture the contact pins from a material that can endure the burden of the bending working and various materials can be selectively used. In addition, by using a material having less stress relaxation by heat, the initial contacting pressure can be substantially maintained after the heat application. In this embodiment, by using titanium copper alloy or tin nickel copper alloy, the contact pins having less stress relaxation by heat and contact pressure having less change from the initial value in pressure after the heat application can be provided. Further, the contact pins 15 are formed by, first, carrying out the pressing working in the state in which a plurality of contact pins are connected through connection portions 15o with the adjacent contact pins 15 being directed in the reverse directions, and then, removing the contact portions 15o.

Furthermore, the contact pin 15 in this embodiment has the single elastic piece 15c in flat plate shape and elastically deformable in the plate surface direction, so that the movable range thereof can be made smaller in comparison with the contact pin which is elastically deformable in the vertical direction to the plate surface. Moreover, in comparison with the contact pin even having a pair of elastic pieces which is deformable in the plate surface direction, in which the paired elastic pieces are disposed in an overlapped state, the thickness in the plate thickness direction becomes large, and hence, the movable range thereof also becomes large. On the contrary, in the present invention, the contact pin has only one elastic piece 15c, so that the thickness in the plate thickness direction is small, and hence, the movable range thereof can be made small, thus making small the pitch of the contact pins.

Still furthermore, in the present invention, the contact pin 15 is formed such that the inclining portion 15e formed to the plate-shaped contact portion 15d formed to the upper end of the elastic piece 15c is contacted to or separated from the side surface of the solder ball 12b, and accordingly, in comparison with the structure in which the contact portion is contacted at its surface, not side edge portion, to the solder ball, the side edge portion of the contact portion 15d of the present invention slightly bites the solder ball 12b, thereby ensuring the electrical connection between the contact pin 15 and the solder ball 12b.

Still furthermore, in the structure of the present invention, the inclining portion 15e formed to the contact portion 15d of the contact pin 15 contacts the lower spherical portion, except the lowest end, of the solder ball 12b, so that when the elastic force of the elastic piece 15c acts to the inclining portion 15, the inclining portion 15e slides along the lower spherical portion except the lowest end of the solder ball 12b, thus achieving the wiping effect and improving the electrical conductivity.

Moreover, since the contact portion 15d of the contact pin 15 never contact the lowest end of the solder ball 12b, the lowest end is not damaged and any adverse influence is not caused at a time of the electrical contact of the solder ball 12b to the printed circuit board.

In addition, in the present invention, since the contact pin 15 is constructed such that the inclining portion 15e of the contact portion 15d contacts the side surface of the solder ball 12b along the diameter direction, the causing of injury or damage to the solder ball can be reduced.

Figure 16:
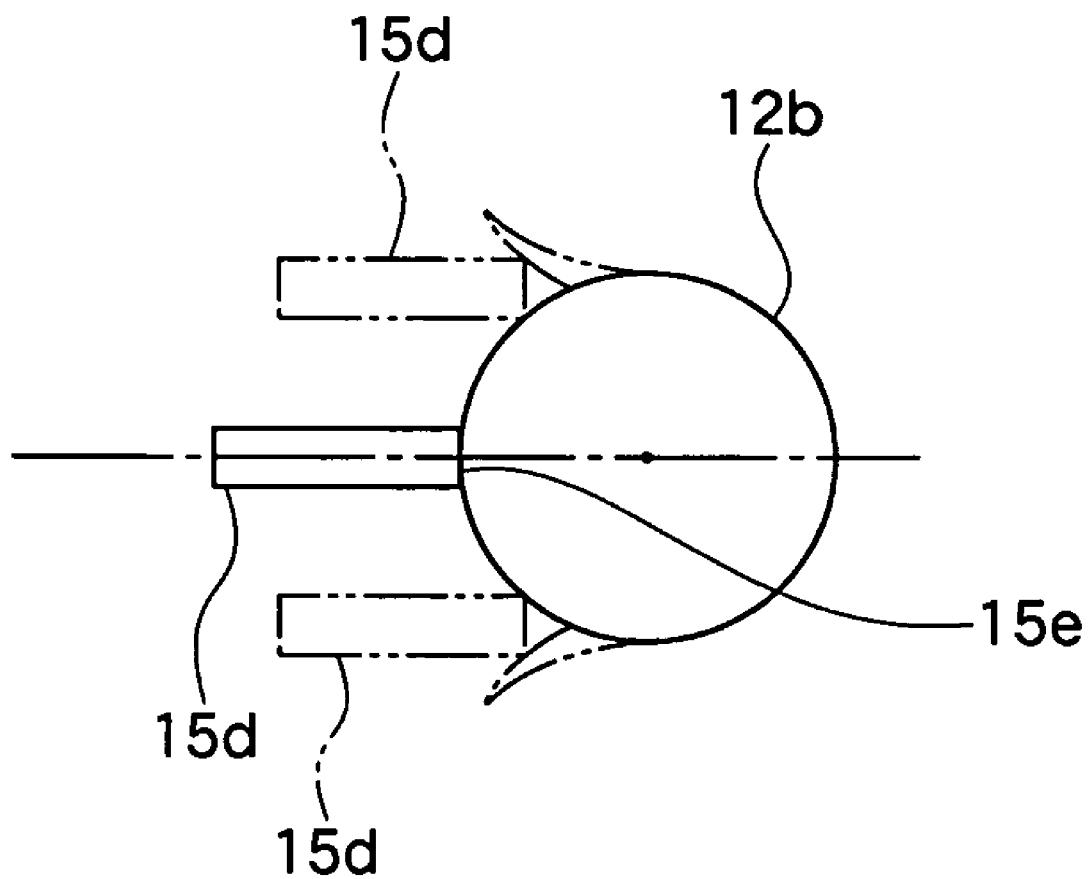
FIG. 16 is an illustration for the explanation of the contacting condition of the contact pin to a solder ball according to the first embodiment.

That is, as shown in FIG. 16, when the contacting direction of the contact portion 15d is shifted from the diameter direction of the solder ball 12b as shown with two-dot-chain line, the contact portion 15d acts as if it scrubs the side portion of the solder ball 12b, so that there is a fear such that a burr or large flaw may be caused to the solder ball 12b as shown with two-dot-chain line. On the other hand, in the structure in which the side edge portion (i.e. inclining portion 15e) of the contact portion 15d contacts the side surface of the solder ball along its diameter direction, even if the solder ball is softened, the side edge portion of the contact portion 15d merely slightly bites, thereby preventing the large injury or the like from being caused to the solder ball.

Figure 15:
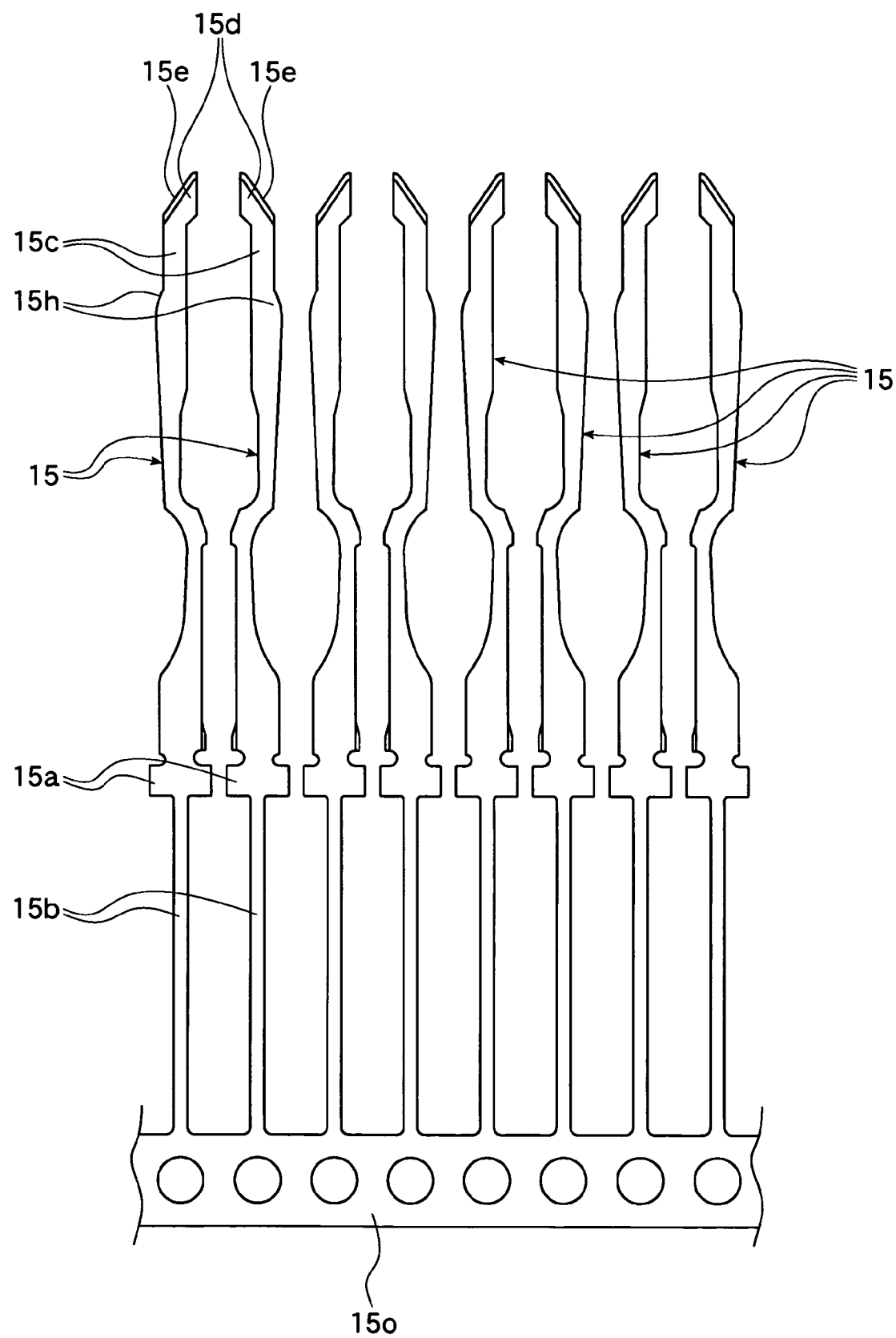
FIG. 15 is a front view explaining a manufacturing process of the contact pin of the first embodiment of the present invention.

Furthermore, the adjacent contact pins 15 of a number of contact pins 15 serve to apply forces in the directions different from each other, so that the contact pins 15 can be easily arranged. That is, such contact pins 15 can be formed through the press working in the state such that the contact pins are directed in the directions different from (i.e. opposite to) each other as shown in FIG. 15, and can be arranged to the socket body 13 in this pressed arrangement as it is.

Of course, a number of contact pins 15 directed in the same direction may be formed and they are arranged by alternately changing the direction.

In addition, since the operation force of the contact pin 15 is half in comparison with a contact pin provided with a pair of elastic pieces, the operation member 21 can be driven with less force, so that many contact pins could be arranged.

Further, the shape of the contact portion 15d of the contact pin 15 is not limited to the shape of the embodiment described above and many other alternated shapes such as shown in FIGS. 17A, 17B and 17C may be adopted.

That is, the inclining portion 15e formed to the contact portion 15d of FIG. 17A has a length smaller than that of the described embodiment shown in FIG. 7, for example, and has an inclination angle larger than that thereof.

The inclining portion 15e formed to the contact portion 15d of FIG. 17B has a perpendicular portion 15m so as to contact the solder ball 12b at its side surface. Furthermore, the contact portion 15d of FIG. 17C also has an inclining portion 15n slightly inclined in a direction reverse to that shown in FIG. 17A, and the contact portion having this inclining portion 15n contacts the solder ball 12b at a portion slightly higher than the center of the spherical solder ball 12b.

Figure 18A:
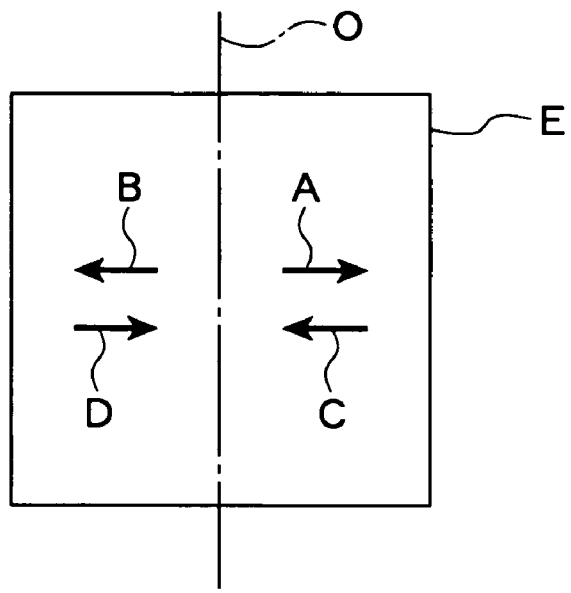
FIGS. 18A and 18B are views showing modified examples of the contact pin arrangement.
Figure 18B:
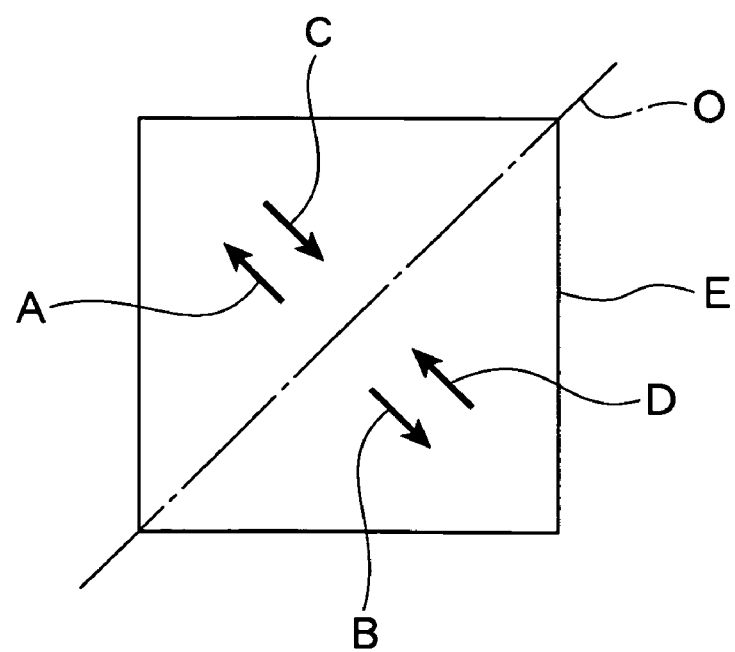

FIGS. 18A and 18B show illustrated examples of the contact pins alternated in their directions or arrangements.

That is, in the embodiment described hereinbefore, the adjacent contact pins 15 are arranged such that the operating forces of the adjacent contact pins 15 act in opposite directions to each solder ball 12b. However, the present invention is not limited to such arrangement and many other arrangements of the contact pins may be adopted as long as the forces of the contact pins take equilibrium condition.

For example, as shown in FIG. 18A, the contact pins 15 are arranged so that the operation forces are directed in one direction such as "A" direction and the other ones are arranged such that the operation forces are directed in the reverse direction "B" opposite to the "A" direction with the center line O in the arrangement area E being the boundary of these arrangements, and on the other hand, the operation forces may be directed in the opposite (facing) directions as shown with the arrows "C" and "D".

Furthermore, as shown in FIG. 18B, the contact pins 15 are arranged so that the operation forces are directed in one direction such as "A" direction and the other ones are arranged such that the operation forces are directed in the reverse direction "B" opposite to the "A" direction with the diagonal center line O in the arrangement area E being the boundary of these arrangements, and on the other hand, the operation forces may be directed in the opposite (facing) directions as shown with the arrows "C" and "D".

It is to be further noted that the present invention is not limited to the described embodiments and examples and many other changes and modifications may be made without departing from the scopes of the appended claims.

For example, the present invention is applied to the IC socket as socket for electrical parts, but it may be applied to the other devices or apparatus.

What is claimed is:

1. A socket for an electrical part including a socket body provided with an accommodation portion in which an electrical part having spherical terminals is accommodated and contact pins arranged so as to be contacted to or separated from the terminals, respectively, and a movable member for elastically deforming the contact pins in a horizontal direction, wherein:

each of the contact pins includes one elastic piece in form of plate having conductivity and elasticity so as to be elastically deformable along a plate surface direction, and the contact pin has a contact portion in form of plate formed at an upper portion of the elastic piece, the contact portion having a side edge portion which is contacted to or separated from a side surface of the spherical terminal, the contact pins are arranged such that contacting directions of the contact pins differ so that horizontal forces to be applied from the contact pins to the terminals are equilibrium in a whole structure of the socket body.

2. The socket for an electrical part according to claim 1, wherein the adjacent contact pins apply operation forces to the corresponding spherical terminals in directions reverse to each other.

3. The socket for an electrical part according to claim 1, wherein the contact pin contacts the spherical terminal such that the side edge portion of the contact portion of the contact pin contacts the side surface of the terminal in the direction along a diameter direction thereof.

4. The socket for an electrical part according to claim 1, wherein the contact portion of the contact pin has an inclining portion which contacts a surface of a lower half portion of the spherical terminal except a lowest portion thereof.

5. The socket for an electrical part according to claim 1, wherein the socket is an IC socket and the terminal is a solder ball.

6. The socket for an electrical part according to claim 1, wherein the contact pin comprises a base portion, a solder tail portion extending downward from the base portion, a single elastic piece extending upward from the base portion so as to be elastically deformable, and a contact portion formed to an upper portion of the elastic piece, the contact portion being provided with an inclining portion contacting the spherical terminal.

7. A socket for an electrical part comprising:

a socket body to which an accommodation portion is formed so as to accommodate the electrical part and to which a number of contact pins are provided so as to be contacted to or separated from terminals of an electrical part;

a movable member formed to the socket body to deform the contact pin through vertical movement thereof; and an operation member for vertically moving the movable member, wherein:

the contact pin includes a single elastic piece in form of plate member having conductivity and elasticity so as to be elastically deformable by the movement of the movable member along a plate surface direction, and the contact portion of the contact pin has a side edge portion which is contacted to or separated from a side surface of the spherical terminal, and the contact pins are arranged such that contacting directions of the contact pins differ so that horizontal forces to be applied from the contact pins to the terminals are equilibrium in a whole structure of the socket body.

8. A socket for an electrical part including a socket body provided with an accommodation portion in which an electrical part having spherical terminals is accommodated and contact pins arranged so as to be contacted to or separated from the terminals, respectively, and a movable member for elastically deforming the contact pins in a horizontal direction, wherein:

each of the contact pins includes one elastic piece in form of plate having conductivity and elasticity so as to be elastically deformable along a plate surface direction, and the contact pin has a contact portion in form of plate formed at an upper portion of the elastic piece, the contact portion having a side edge portion which is contacted to or separated from a side surface of the spherical terminal, and the contact portion of the contact pin includes an inclining portion which contacts a surface of a lower half portion of the spherical terminal except a lowest portion thereof.

* * * * *